(12) United States Patent
Martin et al.

(10) Patent No.: US 10,553,148 B2
(45) Date of Patent: Feb. 4, 2020

(54) MODULE FOR A VIDEO WALL

(71) Applicant: OSRAM Opto Semiconductors GmbH, Regensburg (DE)

(72) Inventors: Alexander Martin, Regensburg (DE); Thomas Schwarz, Regensburg (DE); Frank Singer, Regenstauf (DE); Andreas Plössl, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 9 days.

(21) Appl. No.: 15/775,574

(22) PCT Filed: Nov. 11, 2016

(86) PCT No.: PCT/EP2016/077489
§ 371 (c)(1),
(2) Date: May 11, 2018

(87) PCT Pub. No.: WO2017/081289
PCT Pub. Date: May 18, 2017

(65) Prior Publication Data
US 2018/0322824 A1 Nov. 8, 2018

(30) Foreign Application Priority Data
Nov. 13, 2015 (DE) .......................... 10 2015 119 653

(51) Int. Cl.
*G09G 3/32* (2016.01)
*G06F 3/14* (2006.01)
(Continued)

(52) U.S. Cl.
CPC ............. *G09G 3/32* (2013.01); *G06F 3/1446* (2013.01); *G09G 2300/026* (2013.01);
(Continued)

(58) Field of Classification Search
CPC .... G06F 3/1446; G09G 3/32; G09G 2330/02; G09G 2300/0426; G09G 2300/0452;
(Continued)

(56) References Cited

U.S. PATENT DOCUMENTS 5,125,153 A 6/1992 Frey et al.
8,232,640 B2 7/2012 Tomoda et al.
(Continued)

FOREIGN PATENT DOCUMENTS

CN 103542310 A 1/2014
JP S53-134967 U 10/1978
(Continued)

OTHER PUBLICATIONS

Notice of Reasons for Rejection dated May 14, 2019, of counterpart Japanese Application No. 2018-522587, in English.

*Primary Examiner* — Vinh T Lam
(74) *Attorney, Agent, or Firm* — DLA Piper LLP (US)

(57) ABSTRACT

A module for a video wall includes a first light emitting chip of an image pixel connecting to a first power line by a first electrical terminal, the first light emitting chip connects to a third power line by a second electrical terminal, a second light emitting chip of the image pixel connects to a second power line by the first electrical terminal, the second light emitting chip of the image pixel connects to a fourth power line by the second electrical terminal, the first and/or the second power line are/is a surface metallization, including contact sections, a light emitting chip is arranged on a contact section, at least between contact sections of a first and of a second power line an insulation layer is provided on a carrier, the insulation layer includes openings above the contact sections, and the light emitting chips are arranged in the openings.

17 Claims, 13 Drawing Sheets

(51) Int. Cl.
*H01L 25/075* (2006.01)
*H01L 33/62* (2010.01)

(52) U.S. Cl.
CPC ............... *G09G 2300/0426* (2013.01); *G09G 2300/0452* (2013.01); *G09G 2330/02* (2013.01); *H01L 25/0753* (2013.01); *H01L 33/62* (2013.01); *H01L 2224/48227* (2013.01); *H01L 2224/92247* (2013.01)

(58) Field of Classification Search
CPC .......... G09G 2300/026; H01L 25/0753; H01L 33/62; H01L 2224/48227; H01L 2224/92247
See application file for complete search history.

(56) References Cited

U.S. PATENT DOCUMENTS

| | | | |
|---|---|---|---|
| 9,494,302 | B2 | 11/2016 | Shen et al. |
| 9,859,330 | B2 | 1/2018 | Von Malm et al. |
| 2010/0258822 | A1 | 10/2010 | Kobayashi |
| 2010/0295088 | A1* | 11/2010 | D'Evelyn ........... H01L 33/0079 257/99 |
| 2014/0353694 | A1 | 12/2014 | Pang et al. |
| 2015/0204525 | A1 | 7/2015 | Shen et al. |
| 2016/0260869 | A1* | 9/2016 | Jeon ................ H01L 33/38 |
| 2017/0033038 | A1* | 2/2017 | Nakagawa ........... H05K 1/0253 |
| 2017/0047393 | A1* | 2/2017 | Bower ................. G06F 3/044 |
| 2017/0352304 | A1* | 12/2017 | Funatsu ............ H01L 27/3211 |

FOREIGN PATENT DOCUMENTS

| | | |
|---|---|---|
| JP | S55-52857 U | 4/1980 |
| JP | S55-67179 A | 5/1980 |
| JP | S59-181384 A | 10/1984 |
| JP | 08-202289 A | 8/1996 |
| JP | 09-148629 A | 6/1997 |
| JP | 11-317546 A | 11/1999 |
| JP | 2000-022219 A | 1/2000 |
| JP | 2001-284660 A | 10/2001 |
| JP | 2002-344108 A | 11/2002 |
| JP | 2008-27933 A | 2/2008 |
| JP | 2014-27214 A | 2/2014 |
| JP | 2015-173221 A | 10/2015 |
| WO | 2014/053445 A1 | 4/2014 |
| WO | 2014/139189 A1 | 9/2014 |

* cited by examiner

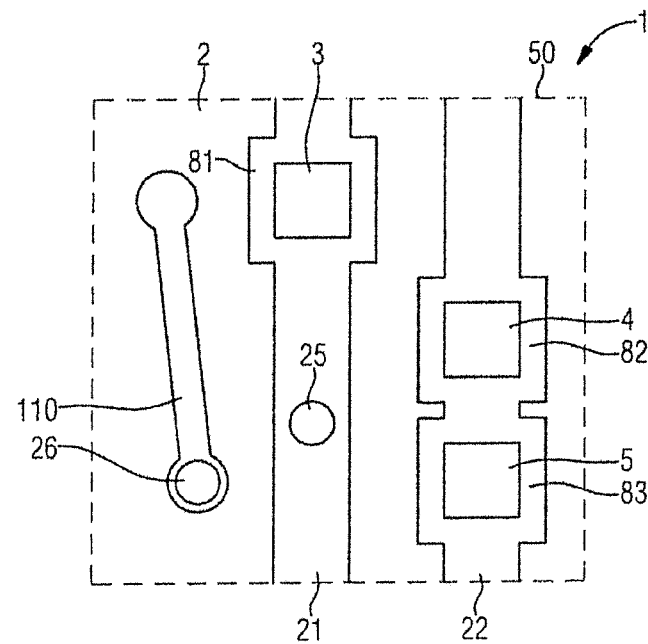
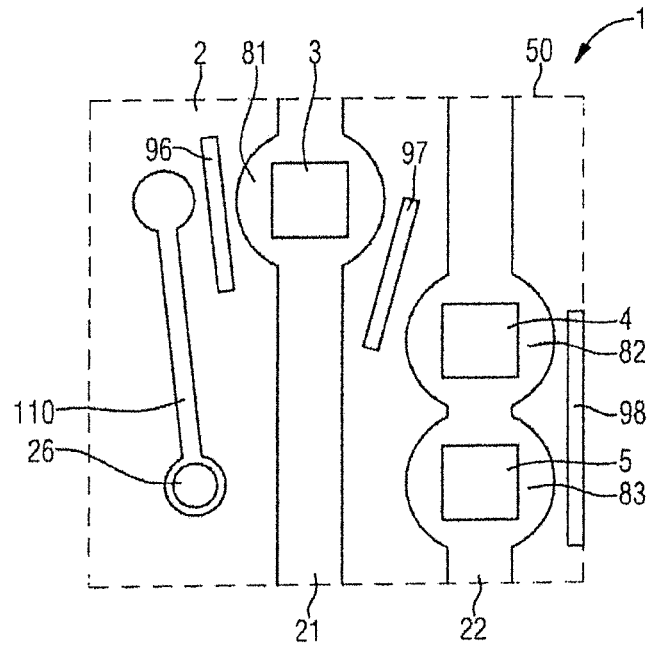

MODULE FOR A VIDEO WALL

TECHNICAL FIELD

This disclosure relates to a module for a video wall.

BACKGROUND

Modules for video walls in which a multiplicity of light emitting chips are arranged are known. In this case, it is known to drive each individual light emitting chip with the aid of a matrix circuit. For this purpose, power lines are arranged in rows and columns, wherein each light emitting chip is connected to a power line of a row and to a power line of a column.

There is nonetheless a need to provide an improved module for a video wall.

SUMMARY

We provide a module for a video wall including a carrier including a multiplicity of image pixels, wherein an image pixel is formed by at least one first and one second light emitting chip, each light emitting chip includes a first and a second electrical terminal, the first light emitting chip of an image pixel connects to a first power line by the first electrical terminal, the first light emitting chip of an image pixel connects to a third power line by the second electrical terminal, the second light emitting chip of the image pixel connects to a second power line by the first electrical terminal, the second light emitting chip of the image pixel connects to a fourth power line by the second electrical terminal, the first and/or the second power line are/is in the form of a surface metallization, the surface metallization includes contact sections, a light emitting chip is arranged on a contact section, at least between contact sections of a first and of a second power line an insulation layer is provided on the carrier, the insulation layer includes openings above the contact sections, and the light emitting chips are arranged in the openings.

BRIEF DESCRIPTION OF THE DRAWINGS

FIG. 12 shows an enlarged excerpt from FIG. 11.

FIG. 13 shows a schematic illustration of a partial excerpt from a conductor track structure of a further example of a module.

LIST OF REFERENCE SIGNS

Figure 1:
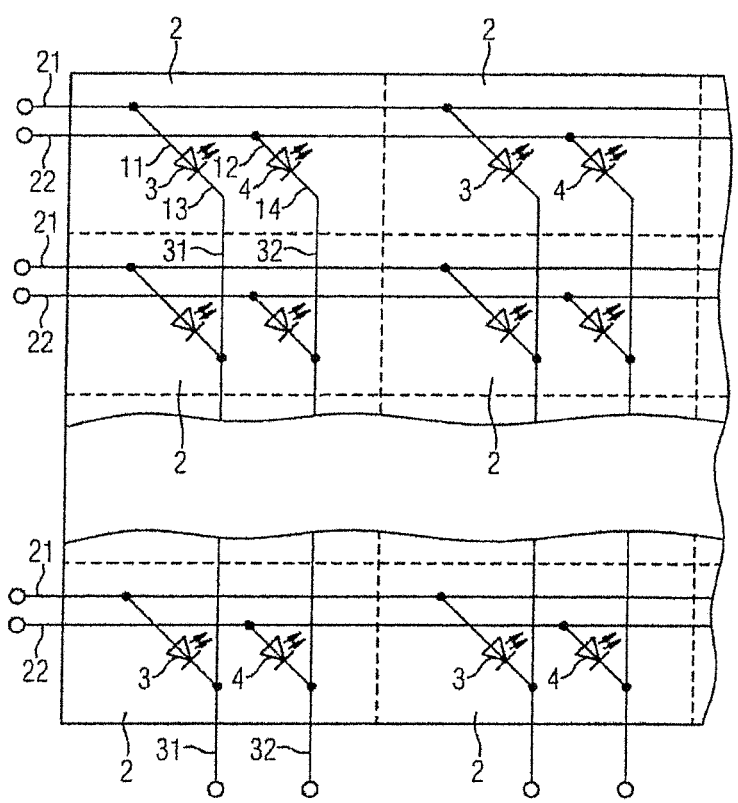
FIG. 1 shows an excerpt from an electrical equivalent circuit diagram of a module for a video wall.

1 Module
2 Image pixel
3 First light emitting chip
4 Second light emitting chip
5 Third light emitting chip
11 First anode terminal
12 Second anode terminal
13 First cathode terminal
14 Second cathode terminal
15 Third anode terminal
16 Third cathode terminal
21 First power line
22 Second power line
25 Plated-through hole
26 Second plated-through hole
31 Third power line
32 Fourth power line
33 Fifth power line
34 Sixth power line
40 Driver circuit
41 First multiplexer
42 Second multiplexer
45 Adhesive layer
46 Conductive layer
50 Carrier
51 First row
52 Second row
53 Third row
61 First plated-through hole
62 Second plated-through hole
63 Third plated-through hole
71 First line connection
72 Second line connection
73 Third line connection
81 First contact section
82 Second contact section
83 Third contact section
91 Stepped configuration
92 First insulation web
93 Second insulation web
94 Third insulation web
95 Fourth insulation web
96 Fifth insulation web
97 Sixth insulation web
98 Seventh insulation web
99 Insulation layer
100 Film
110 Redistribution conductor track
120 Alignment structure
130 Opening

DETAILED DESCRIPTION

One advantage of our module is that an image pixel comprising two light emitting chips is provided, wherein four different power lines for a voltage supply are provided for the two light emitting chips. In this way, different voltages may be provided for two light emitting chips of an image pixel. Consequently, light emitting chips may be supplied with the voltages that the light emitting chips require for corresponding generation of light.

An image pixel may comprise three light emitting chips, wherein three different voltages are provided for the three light emitting chips of an image pixel. Consequently, the corresponding required voltage may also be provided for more than two light emitting chips of an image pixel.

An image pixel may comprise three light emitting chips, wherein two light emitting chips are supplied with the same voltage and a third light emitting chip is supplied with a different voltage.

The power lines for the positive power supply of the light emitting chips may be led in one plane, whereas the power lines for the negative power supply of the light emitting chips are led in a second plane. The power lines may be arranged in different planes of a carrier, in particular of a circuit board.

The different planes and the power lines contained therein may be led via plated-through holes to a common connecting plane. A compact construction of the module is possible in this way.

The light emitting chips may be arranged in rows, wherein at least two light emitting chips, in particular three light emitting chips, of a row are each combined to form an image pixel. The first and the second power line that provide different positive voltages, may be arranged at opposite sides of a row. A compact construction comprising short power line paths may be achieved in this way.

The first and the third power line may be in the form of a surface metallization, wherein the surface metallization comprises strip sections and contact sections, wherein a light emitting chip is arranged on a contact section, and wherein the contact section comprises a smaller area than the light emitting chip. A sufficient lateral spacing between contact sections of different light emitting chips is provided in this way.

The light emitting chips may comprise a lateral stepped configuration on the side assigned to the contact section. That area of the light emitting chip assigned to the contact section is reduced in this way. By this means, too, it is possible to enlarge the lateral spacing between adjacent contact sections or the contact regions of adjacent light emitting chips.

Electrical insulations may be provided between contact sections and adjacent light emitting chips. The electrical insulation of adjacent contact sections is improved as a result. At least between two contact sections of a first and of a second power line an insulation layer is provided on the carrier, wherein the insulation layer comprises openings above the contact sections, and wherein the light emitting chips are arranged in the openings. The entire top side of the module may be provided with an insulation layer.

The light emitting chips may connect to the contact sections with the aid of electrically conductive contact films. A precise delimitation of the electrically conductive areas may be achieved as a result. Consequently, a desired lateral spacing between adjacent contact sections and thus the desired electrical insulation between adjacent contact sections may be reliably achieved.

A light emitting chip may connect to a contact section with the aid of a solder connection, in particular by an AuSn solder connection, wherein the solidus temperature of the solder connection is above 260° C. What is thus achieved is that during a later SMT mounting of the module on a circuit board, during which it is possible for the module to be heated up to 260° C., the light emitting chip does not detach from the carrier or the contact section. Furthermore, the light emitting chips may connect to the contact section with the aid of a friction welding connection and/or with the aid of a soldering with a solder material comprising gold, tin, copper and silver.

An insulation web may be provided between contact sections of a first and of a second power line. The electrical isolation between the first and the second power line is improved thereby.

A light emitting chip may be secured on a contact section of a power line with the aid of an electrically conductive adhesive film. As a result, little space is taken up, which moreover is precisely defined.

A light emitting chip may comprise a stepped configuration on an underside facing a contact section of a power line such that an area of the underside of the light emitting chip is formed in a smaller fashion. The lateral space requirement is reduced as a result.

At least one light emitting chip may be mechanically secured on a contact section with the aid of an electrically insulating adhesive, wherein tips of a metallic contact of the light emitting chip penetrate through the adhesive and are in electrical contact with the contact section.

At least two light emitting chips may be arranged in an opening of the insulation layer. A closer arrangement of the light emitting chips in the opening is made possible as a result. The two light emitting chips may be configured to emit light comprising the same wavelength or comprising different wavelengths. By way of example, one light emitting chip may emit green light and the other light emitting chip may emit blue light. Moreover, it is also possible for more than two light emitting chips, in particular three or more light emitting chips, to be arranged in an opening. By way of example, one light emitting chip may emit green light, the second light emitting chip may emit blue light and the third light emitting chip may emit red light.

The above-described properties, features and advantages and the way in which they are achieved will become clearer and more clearly understood in association with the following description of examples explained in greater detail in association with the drawings.

FIG. 1 shows, in a schematic illustration, an electrical equivalent circuit diagram of a module 1 comprising light emitting chips 3, 4 for a video wall. The module 1 comprises a multiplicity of image pixels 2. Each image pixel 2 comprises at least one light emitting chip, in particular two or more light emitting chips 3, 4. Each image pixel 2 comprises a first and a second light emitting chip 3, 4. The first light emitting chip 3 of an image pixel 2 connects to a first power line 21 by a first anode terminal 11. The second light emitting chip 4 of the image pixel 2 connects to a second power line 22 by a second anode line 12. A first cathode terminal 13 of the first light emitting chip 3 connects to a third power line 31. The second light emitting chip 4 of the image pixel 2 connects to a fourth power line 32 by a second cathode terminal 14.

The third and the fourth power line 31, 32 connect to ground potential. The first and the second power line 21, 22 connect to positive potentials of different magnitudes relative to ground. By way of example, the first power line 21 may connect to 2.60 volts. The second power line 22 may connect to 3.7 volts. Consequently, the first light emitting chip 3 that generates red light, for example, is supplied with the required voltage of 2.6 volts. The second light emitting chip 4 that generates blue or green light, for example, is supplied with a voltage of 3.7 volts. The module 1 comprises a multiplicity of image pixels 2 configured identically and the light emitting chips 3, 4 of which connect to corresponding power lines. The image pixels may be arranged in rows and columns. Moreover, the first and the second power lines are arranged in rows and the third and fourth power lines are arranged in columns.

Figure 2:
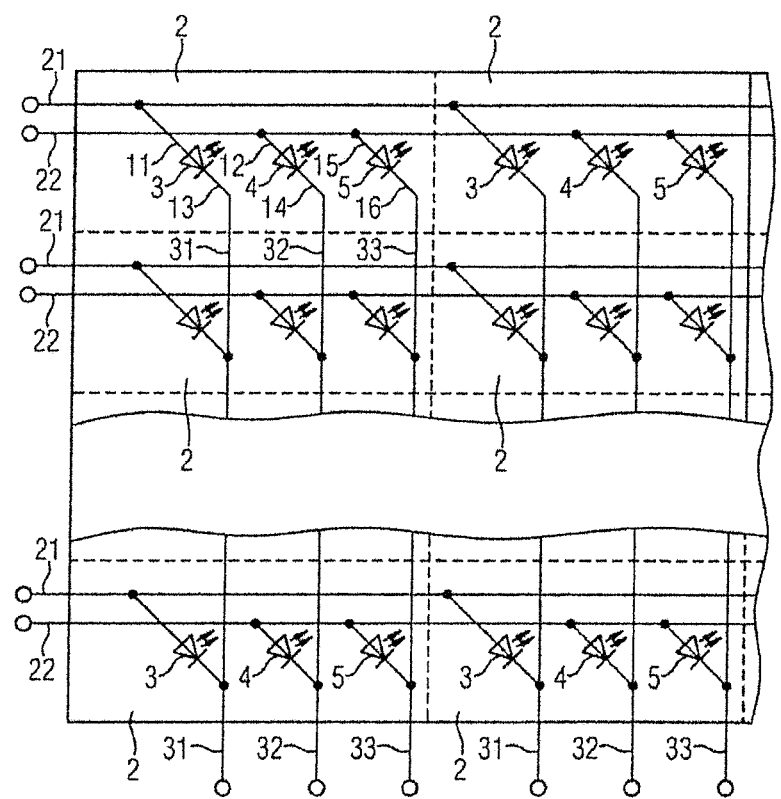
FIG. 2 shows a schematic illustration of an excerpt from an electrical equivalent circuit diagram of a further example of a module for a video wall.

FIG. 2 shows a further example in which an image pixel 2 comprises a first light emitting chip 3, a second light emitting chip 4 and a third light emitting chip 5. The first light emitting chip 3 of an image pixel 2 connects to a first power line 21 as in FIG. 1. The second light emitting chip 4 of an image pixel 2 connects to a second power line 22 as in FIG. 1. The third light emitting chip 5 connects to the second power line 22 by a third anode terminal 15. The third light emitting chip 5 additionally connects to a fifth power line 33 by a third cathode terminal 16. Consequently, the second and the third light emitting chip 4, 5 are supplied with the same voltage, in particular with a voltage of 3 to 3.7 volts. Just like the third and the fourth power line 31, 32, the fifth power line 33 connects to ground. All the image pixels 2 of the module interconnect in this manner. The second light emitting chip 4 constitutes, for example, a light emitting diode that generates green light. The third light emitting chip 5 constitutes, for example, a light emitting diode that generates blue light. The image pixels may be arranged in rows and columns. Moreover, the first and the second power lines are arranged in rows and the third, the fourth and the fifth power lines are arranged in columns.

Figure 3:
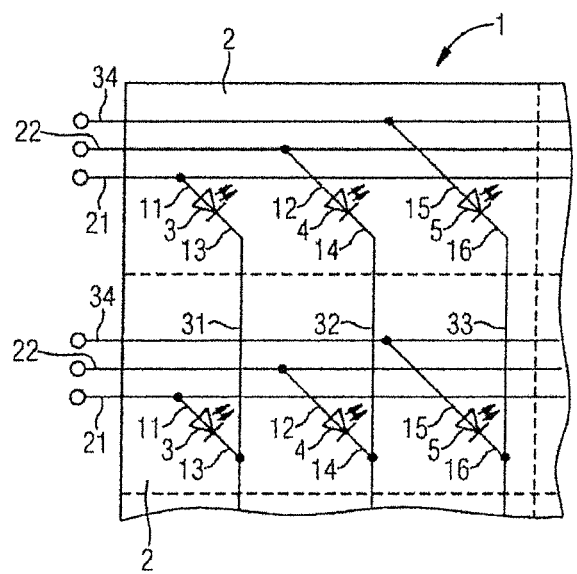
FIG. 3 shows an excerpt from an electrical equivalent circuit diagram of a further example of a module for a video wall.

A module 1 may also comprise a multiplicity of image pixels 2 configured in accordance with the example in FIG. 3. In this example, an image pixel comprises a first, a second and a third light emitting chip 3, 4, 5, wherein the anode terminals 11, 12, 15 connect to different power lines, i.e., to a first, a second and a sixth power line 21, 22, 34. Consequently, in this example, each light emitting chip 3, 4, 5 of an image pixel 2 may be supplied with different voltages. The cathode terminals 13, 14, 16 of the three light emitting chips 3, 4, 5 connect to different power lines 31, 32, 33, wherein the power lines 31, 32, 33 connect to ground.

It is also possible for more than three light emitting chips of an image pixel to be supplied with different supply voltages by the anode terminals by means of different power lines.

Different image pixels comprising a different number of light emitting chips may be combined in one module. Moreover, groups of light emitting chips of an image pixel may be supplied with identical voltages.

Figure 4:
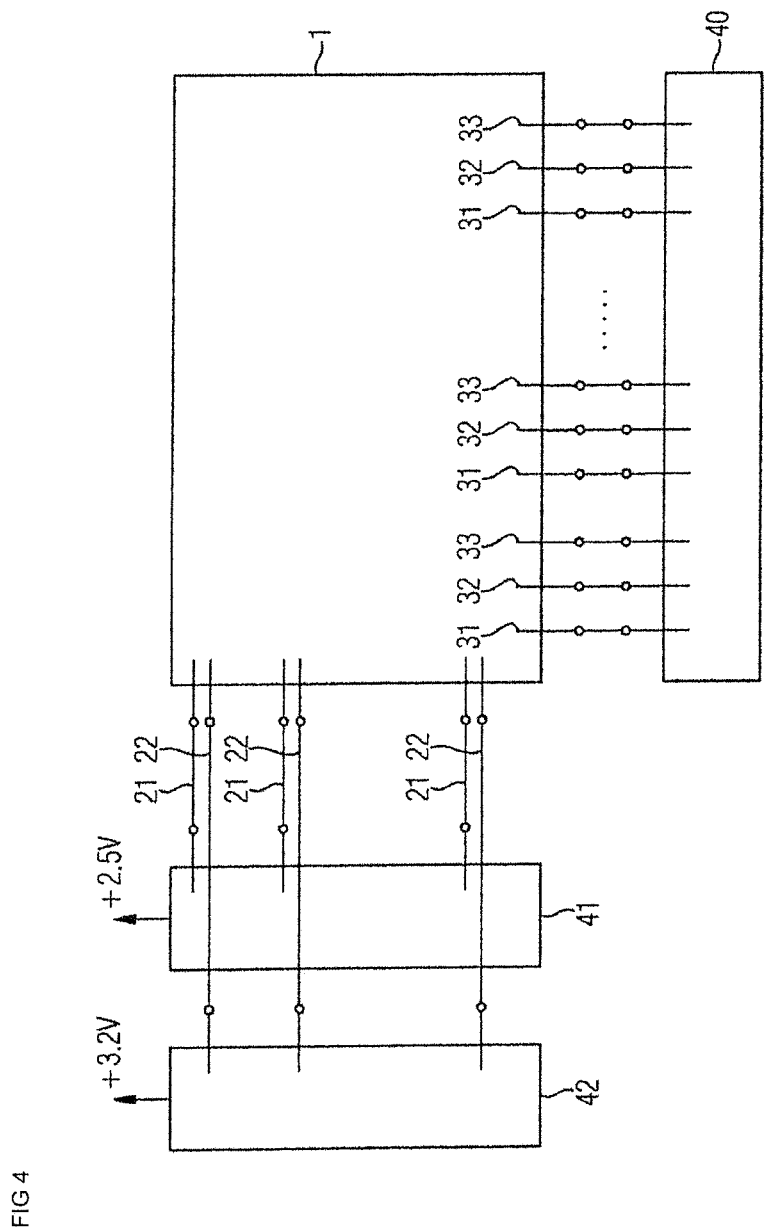
FIG. 4 shows a schematic illustration of a control circuit for driving individual light emitting chips of a module.

FIG. 4 shows, in a schematic illustration, a circuit arrangement that drives the individual pixels of a module 1 constructed in accordance with FIG. 2. The module 1 connects to a driver circuit 40 that supplies all third, fourth and fifth power lines 31, 32, 33 of the image pixels 2 with ground potential. In this case, switches may be provided that connect the individual power lines to ground or isolate them from ground.

In addition, a first multiplexer 41 is provided that connects to the first power lines 21 and supplies the first power lines 21 of the image pixels 2 with a first positive voltage, for example, with 2.5 volts. Furthermore, a second multiplexer 42 is provided that connects to the second power lines 22 of the image pixels and supplies the second power lines 22 with a second positive voltage, for example, with 3.6 volts. The first and the second multiplexer 41, 42 and the driver circuit 40 are configured to drive individual image pixels and individual light emitting chips of the module 1 depending on a chosen driving.

Figure 5:
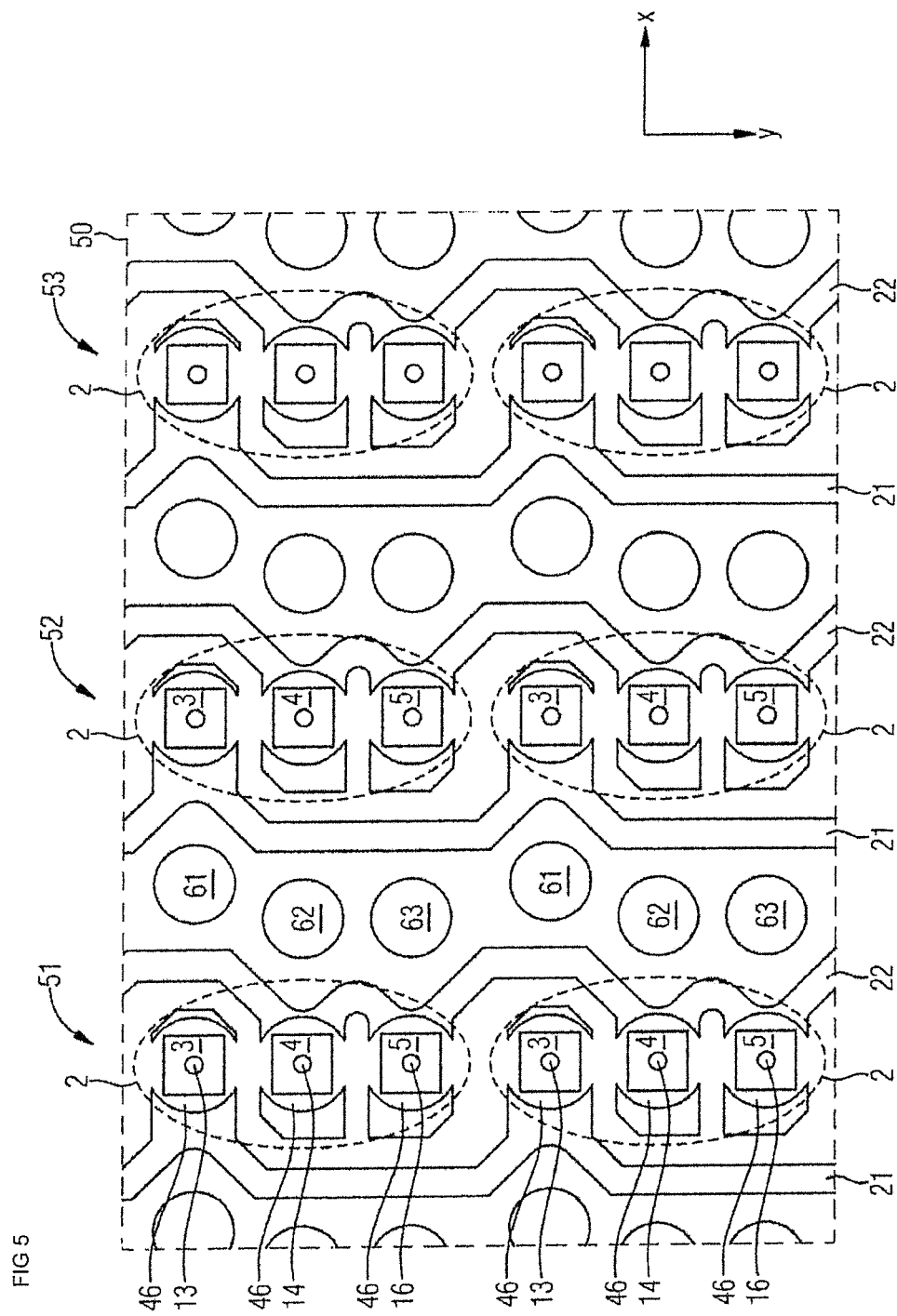
FIG. 5 shows a schematic illustration of a conductor track structure of a carrier.

FIG. 5 shows, in a schematic illustration, a conduction plane applied on a carrier 50. The carrier 50 may be formed, for example, in the form of a substrate or in the form of a circuit board. Light emitting chips 3, 4, 5 are arranged in a first, in a second and in a third row 51, 52, 53 on the carrier 50. The rows are arranged parallel to one another. Three light emitting chips 3, 4, 5 arranged in a row are each respectively combined to form an image pixel 2. Image pixels of different rows may also be combined to form an image pixel. Moreover, each image pixel may also comprise more or fewer light emitting chips. In this example, each image pixel 2 comprises a first, a second and a third light emitting chip 3, 4, 5. The image pixels are arranged in lines perpendicular to the rows. The first light emitting chip 3 may emit red light, for example, the second light emitting chip 4 green light and the third light emitting chip 5 blue light.

In the example illustrated, the light emitting chips 3, 4, 5 are formed in the form of vertical light emitting chips, wherein an anode terminal is formed on an underside of a light emitting chip 3, 4, 5 and a cathode terminal 13, 14, 16 is formed on a top side. A first power line 21 is formed in each case on a left side of a row 51, 52, 53. Each second power line 22 is arranged on a right side of a row. Moreover, in the example illustrated, plated-through holes 61, 62, 63 are provided between a second power line 22 and an adjacent first power line 21. The plated-through holes may lead into a deeper plane of the carrier 50 or onto an underside of the carrier 50. The first and the second power lines 21, 22 are formed in the form of metallic conductor tracks. The light emitting chips 3, 4, 5 connect to the corresponding first power line 21 or the corresponding second power line 22 by an underside, that is to say by the anode terminals. Electrically conductive layers 46, in particular electrically conductive adhesive layers, are provided for this purpose. The anode terminals may also be arranged on the top side and the cathode terminals on the underside of the light emitting chips 3, 4, 5.

The anode terminals and/or the cathode terminals of the light emitting chips 3, 4, 5 may be formed from a metallic material comprising a rough surface comprising tips or comprising an uneven surface. The undersides of the light emitting chips 3, 4, 5 comprising the anode terminals and/or comprising the cathode terminals are mechanically secured on corresponding contact sections 81, 82, 83 of the conductor tracks with the aid of electrically insulating adhesive layers. The rough or uneven surface of the anode terminals and/or of the cathode terminals is assigned to the respective contact section 81, 82, 83, at least individual tips or part of the surface of the anode terminal and/or of the cathode terminal penetrating through the electrically insulating adhesive and being in electrical contact with the assigned contact section.

Both the anode terminal and the cathode terminal may be arranged on the underside of a light emitting chip 3, 4, 5. In this example, for both the contacting of the anode terminal and the contacting of the cathode terminal a corresponding contact section is provided on the carrier. Moreover, the anode terminal of a light emitting chip may electrically conductively connect to a first contact section and the cathode terminal of the light emitting chip may electrically conductively connect to a second contact section. The electrically conductive connection may be carried out via electrically conductive adhesives or via solder material. Moreover, the electrically conductive connection may also be carried out via electrically insulating adhesives and anode terminals and cathode terminals comprising uneven surfaces or rough surfaces comprising tips which penetrate through the insulating adhesive and contact the assigned contact sections.

Figure 6:
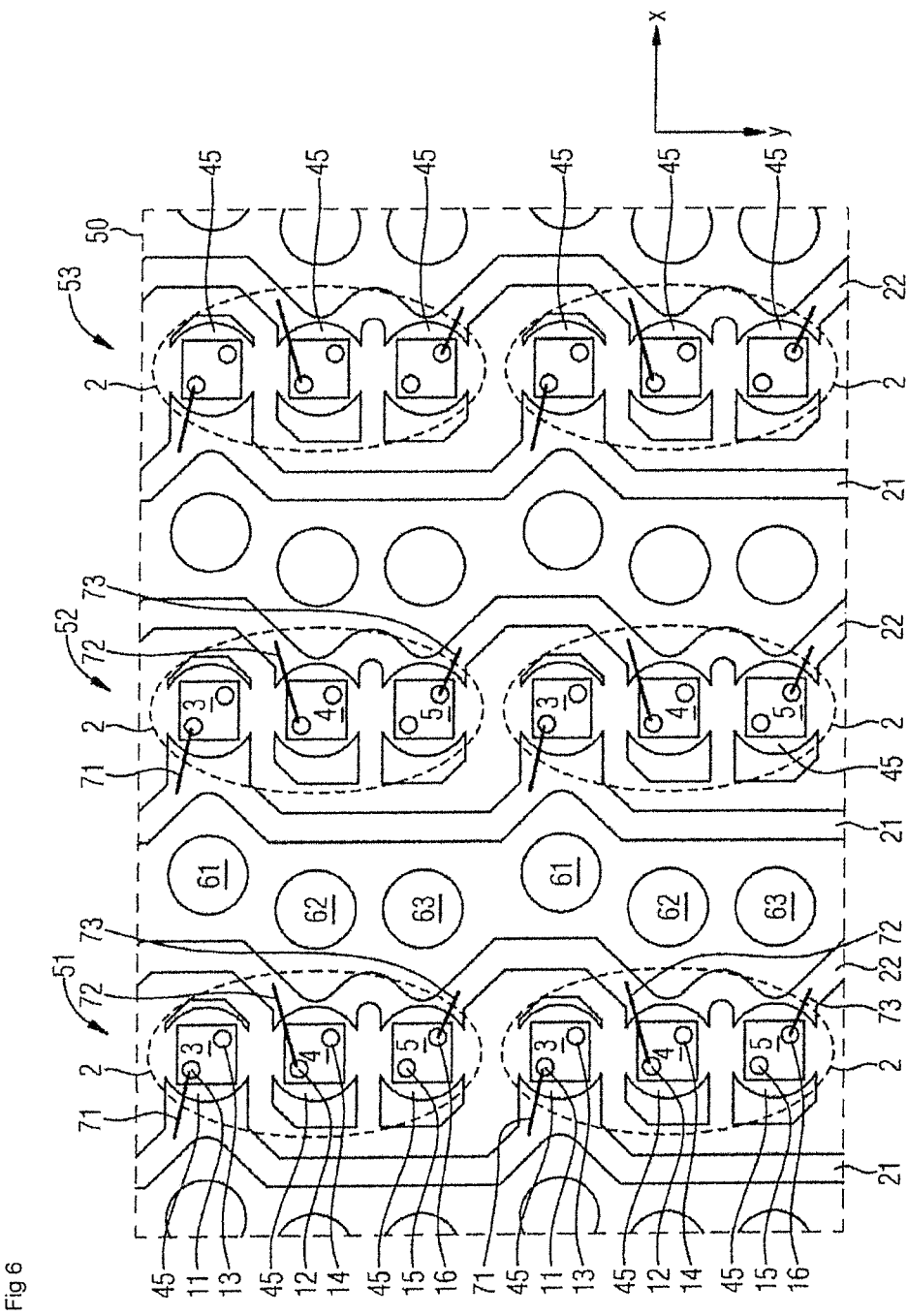
FIG. 6 shows a schematic illustration of an excerpt from a conductor track plane of a further example of a module.

FIG. 6 shows a further example in which the arrangement of the power lines 21, 22 and the light emitting chips 3, 4, 5 of the image pixels 2 corresponds to FIG. 5, but wherein the light emitting chips 3, 4, 5 are formed as horizontal light emitting diodes. In horizontal light emitting diodes, both the anode terminals 11, 12, 15 and the cathode terminals 13, 14, 16 are formed on the top side. Consequently, in this example, the anode terminals 11, 12, 15 must also connect via line connections 71, 72, 73 to the first or respectively the second power lines 21, 22. The line connections may be formed, for example, in the form of bond wires. By way of example, it is possible to form a light emitting chip comprising AlGaInP arranged on a carrier comprising sapphire. Moreover, in a light emitting chip comprising an electrically conductive substrate it may be advantageous for an electrical insulation to be formed between the undersides of the light emitting chips 3, 4, 5 and the power lines 21, 22 arranged underneath. The electrical insulation may be formed, for example, in the form of electrically insulating adhesive layers 45. With the aid of the adhesive layers, the light emitting chips 3, 4, 5 may mechanically connect to the carrier 50. Further electrical line connections are required between the cathode terminals 13, 14, 16 and the third, fourth and fifth power lines. A plated-through hole 61, 62, 63 may be used for this purpose since the third, fourth and fifth power lines are arranged in a different plane than the first and the second power line 21, 22. However, they are not illustrated in FIG. 6 for the sake of better clarity.

Figure 7:
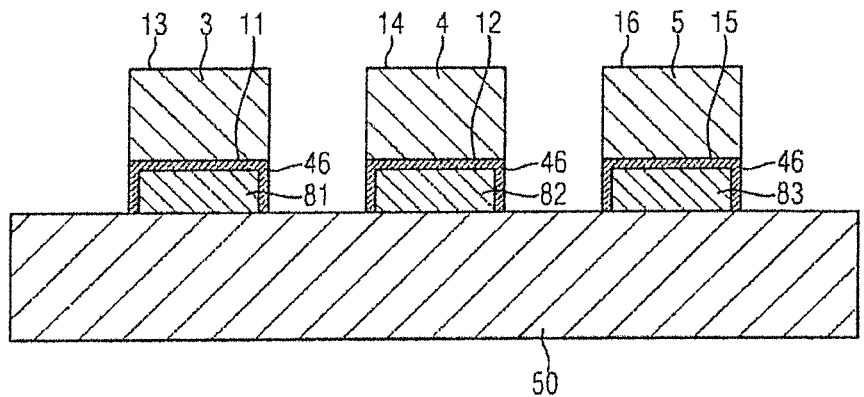
FIG. 7 shows a schematic side view of an image pixel.

FIG. 7 shows an image pixel of a first example in a schematic side view, wherein a first contact section 81 of a first power line 21, a second contact section 82 of a second power line 22 and a third contact section 83 of the second power line 22 are illustrated. The light emitting chips 3, 4, 5 are formed as vertical light emitting diodes in this illustration, wherein an anode terminal 11, 12, 15 is provided on the underside of a light emitting chip 3, 4, 5. Consequently, an anode terminal 11, 12, 15 of the light emitting chips 3, 4, 5 electrically conductively connects to the corresponding contact section 81, 82, 83. For this purpose, electrically conductive layers 46 such as, e.g., solder pads comprising a solder paste are provided, for example, that are formed between the undersides of the light emitting chips 3, 4, 5 comprising the anode terminals and the top sides of the contact sections 81, 82, 83. The solder pastes may be applied by stamping or printing, for example. Moreover, electrically conductive adhesives, in particular printable adhesives, may be provided to form the electrically conductive connection between the anode terminals of the light emitting chips and the contact sections. The contact sections 81, 82, 83 at least in one direction or in both directions may comprise an area of the same size as, or a smaller area than, the light emitting chips 3, 4, 5.

A relatively large lateral distance between the contact sections 81, 82, 83 is achieved as a result. Consequently, a relatively good electrical insulation may be provided in conjunction with a small space requirement.

The contact sections 81, 82, 83 at least in one direction or in both directions may comprise a larger area than the light emitting chips 3, 4, 5. In particular, one contact section may be provided for two or more light emitting chips.

Moreover, the vertical light emitting chips may also comprise cathode terminals on the underside and anode terminals on the top side.

Figure 8:
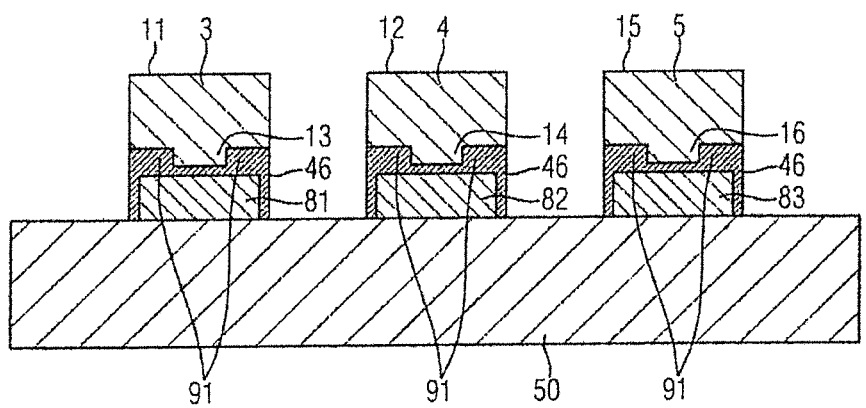
FIG. 8 shows a schematic illustration of a further example of an image pixel of a module.

FIG. 8 shows a further example of an image pixel in a schematic side view, wherein, in this example, the light emitting chips 3, 4, 5 are also formed as vertical light emitting diodes, wherein the cathode terminals 13, 14, 16 are formed on the underside and the anode terminals are formed on the top side. Moreover, the light emitting chips 3, 4, 5 comprise a stepped configuration 91 on the underside, that is to say on the side on which the cathode terminal 13, 14, 16 is formed such that the area with which the light emitting chips 3, 4, 5 bear on the contact sections 81, 82, 83 is smaller than the area of the contact sections 81, 82, 83. Moreover, electrical contact material may be taken up by the stepped configurations 91. By this means, too, electrical contact material is prevented from being pushed laterally to adjacent contact sections during the mounting of the light emitting chips.

Moreover, the vertical light emitting chips may also comprise the cathode terminals on the underside and the anode terminals on the top side.

Figure 9:
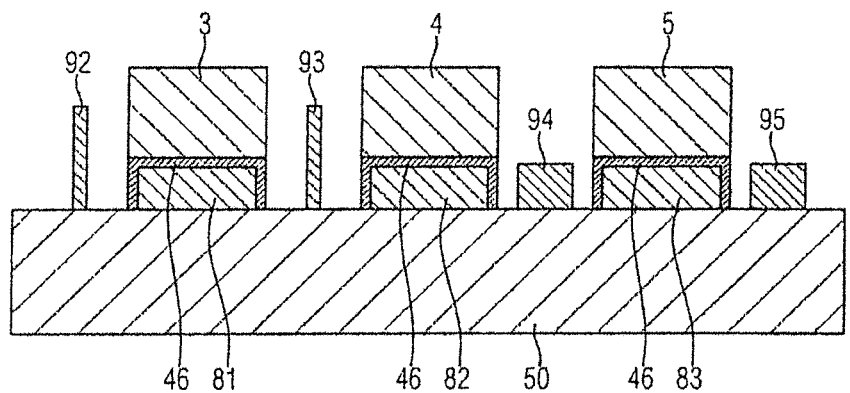
FIG. 9 shows a schematic illustration of a third example of an image pixel.

FIG. 9 shows a further schematic illustration of one example of an image pixel formed in accordance with FIG. 7, but wherein a respective insulation web 92, 93, 94, 95 is arranged between the contact sections 81, 82, 83. The insulation web may be formed from an electrically insulating material such as, for example, photolithographically patternable epoxy (SU8). An improved lateral electrical insulation is achieved by the arrangement of the insulation webs.

Figure 10:
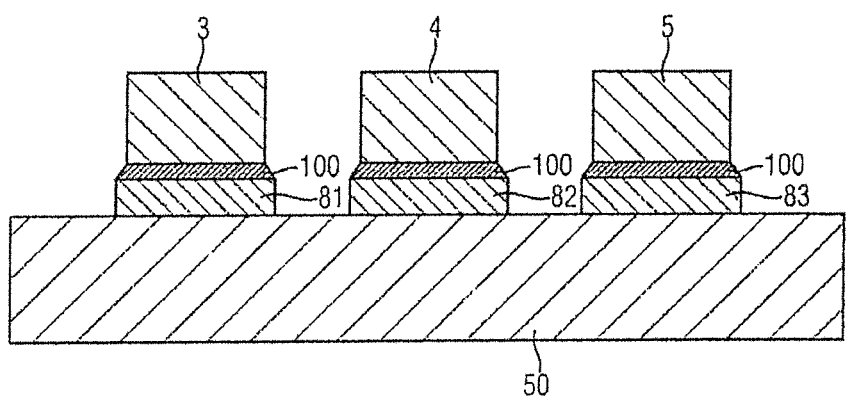
FIG. 10 shows a schematic illustration of a fourth example of an image pixel of a module.

FIG. 10 shows a further schematic illustration of one example of an image pixel in which the light emitting chips 3, 4, 5 electrically contact the contact sections 81, 82, 83 with the aid of electrically conductive films 100. The use of electrically conductive films results in a reliable delimitation of the electrical regions laterally between contact sections 81, 82, 83.

Insulating adhesives may also be used to mount the light emitting chips particularly when the light emitting chips are formed in the form of horizontal light emitting diodes. In this case, however, consideration must be given to ensuring that an electrical contact is nevertheless produced between the anode terminal or respectively the cathode terminal and the assigned contact section.

Moreover, the light emitting chips may be pressed onto a preheated carrier with power lines onto the corresponding contact sections of the power lines, and soldered with a solder metal, e.g., by a hot placement head.

Moreover, the electrical contact between the contact sections 81, 82, 83 and the anode terminals of the light emitting chips 3, 4, 5 may be achieved with the aid of a friction welding connection, for example, using a gold surface on the side of the light emitting chip and a gold surface on the contact section.

Furthermore, the light emitting chips may connect to the contact sections by a solder connection, in particular by an AuSn solder connection, wherein a solidus temperature of the solder connection is above 260° C. Thus, the solder connection is solid up to 260° C. and does not liquefy. Only above a temperature of 260° C. does the solder connection begin to become soft and liquid. What is achieved as a result is that during later SMT mounting of the module on a circuit board, during which heating of the module up to 260° C. is possible, the light emitting chips do not detach from the carrier or the contact sections.

Figure 11:
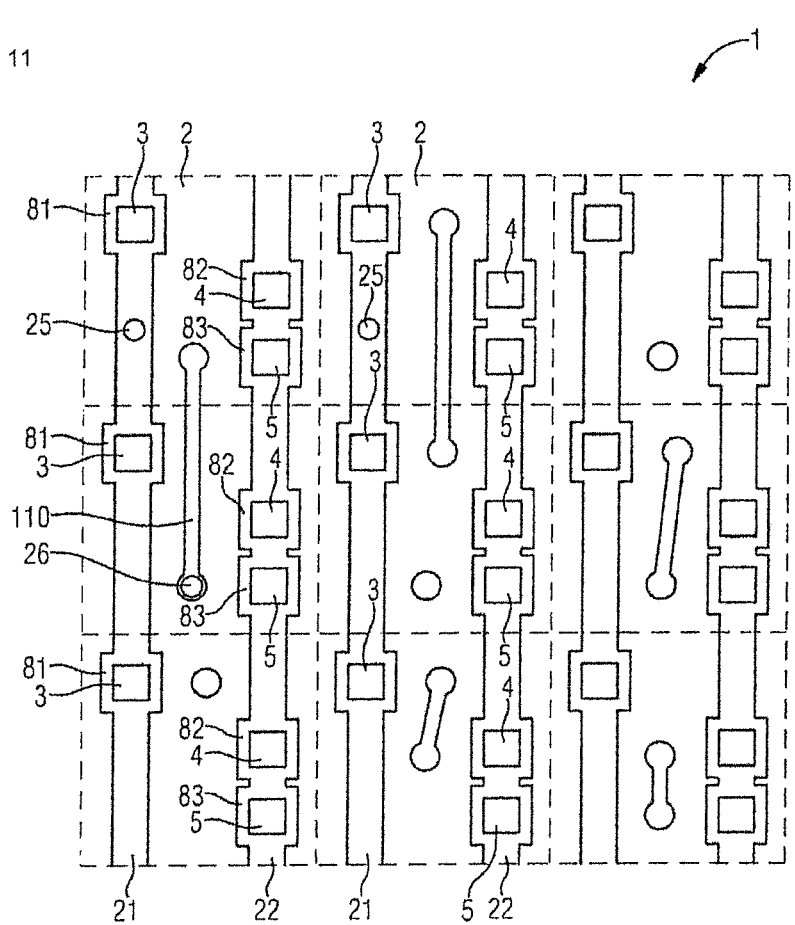
FIG. 11 shows a schematic illustration of a conductor track structure of a module.

FIG. 11 shows an excerpt from a module 1 in a schematic illustration, wherein a plurality of image pixels 2 are arranged on a carrier 50. The image pixels 2 are arranged in a grid indicated by dashed lines. Each image pixel 2 comprises three light emitting chips 3, 4, 5 supplied with positive voltages via a first and a second power line 21, 22. The light emitting chips are formed as vertical light emitting diodes, wherein the anode terminals are arranged on the underside and the cathode terminals are arranged on the top side. The anode terminals connect to the contact sections of the power lines. The electrical connection of the cathode terminals is not illustrated in detail. The first and the second power lines 21, 22 are arranged parallel alongside one another. Moreover, a plurality of pairs of first and second power lines 21, 22 are arranged alongside one another. First contact sections 81 are arranged on the first power line 21, first light emitting chips 3 being arranged on the contact sections. Second and third contact sections 82, 83 are arranged on the second power line 22, a second and respectively a third light emitting chip 4, 5 each being arranged on the second and third contact sections. An image pixel 2 comprises a first, a second and a third light emitting chip 3, 4, 5. The image pixels 2 are illustrated schematically in the form of squares comprising borders. Each image pixel 2 may also comprise more or fewer light emitting chips.

A redistribution conductor track 110 is provided between a first and second power line 21, 22 formed in the form of metallic conductor tracks in the example illustrated. The redistribution conductor track 110 is used to supply the cathode terminals of the light emitting chips with ground potential. The individual line connections are not explicitly illustrated. Furthermore, the first power line 21 comprises a first plated-through hole 25. The first plated-through hole 25 is led either upward or downward into the carrier 50 or onto an underside of the carrier 50 to a further wiring plane. The redistribution conductor track 110 comprises a second plated-through hole 26 led either upward or downward to a further wiring plane.

FIG. 12 shows an image pixel 2 of a further example of a module 1 for a video wall, which image pixel is constructed substantially in accordance with the image pixels 2 in FIG. 11, but wherein the redistribution conductor track 110 is not arranged between the first and the second power line 21, 22, rather the first power line 21 is arranged between the redistribution conductor track 110 and the second power line 22.

FIG. 13 shows a further example of an image pixel 2 of a module 1 for a video wall, which image pixel is formed substantially in accordance with the image pixel in FIG. 11. A fifth, a sixth and a seventh insulation web 96, 97, 98 are additionally formed, however. The fifth insulation web 96 is arranged between the redistribution conductor track 110 and the first contact section 81. In this case, the fifth insulation web 96 extends over the entire length of the first contact section 81. An improved electrical insulation between the redistribution conductor track 110 and the first contact section 81 is achieved in this way. Furthermore, the sixth insulation web 97 is arranged between the first contact section 81 and the second contact section 82. An improved electrical insulation between the first and the second contact section 81, 82 is achieved in this way. Moreover, the seventh insulation web 98 is formed in a manner adjoining an edge region of the image pixel 2. The seventh insulation web 98 extends over the regions of the second and of the third contact section 82, 83. A further, identically formed image pixel is provided in a manner adjoining the image pixel illustrated. The seventh insulation web 98 thus improves the electrical insulation between the second and the third contact section 82, 83 of the image pixel illustrated and the redistribution conductor track 110 of the adjacent image pixel. The light emitting chips 3, 4, 5 illustrated in FIGS. 11 to 13 are formed as vertical light emitting chips, wherein the anode terminals are formed on the underside and the cathode terminals are formed on the top side.

Figure 14:
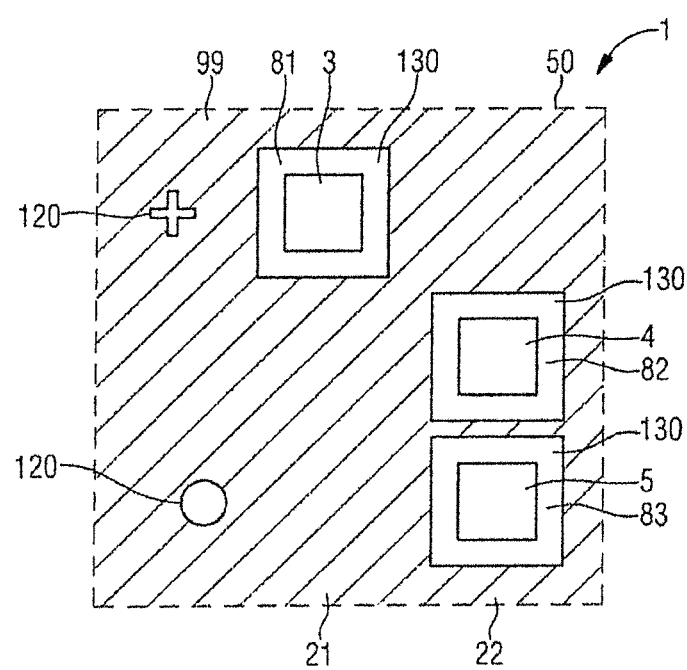
FIG. 14 shows a schematic illustration of a partial excerpt from a module comprising an insulation layer.

FIG. 14 shows a further example substantially corresponding to FIG. 13, but wherein an insulation layer 99 is provided instead of the insulation webs. The insulation layer 99 is arranged on the carrier 50, on the power lines 21, 22, the redistribution conductor track 110 and the second plated-through hole 26. The insulation layer 99 comprises openings 130 above the contact sections 81, 82, 83, the light emitting chips 3, 4, 5 being arranged in the openings. Moreover, the insulation layer 99 comprises alignment structures 120, for example. The insulation layer may be arranged with openings only in the region of the contact sections or over the whole area on the module.

Figure 15:
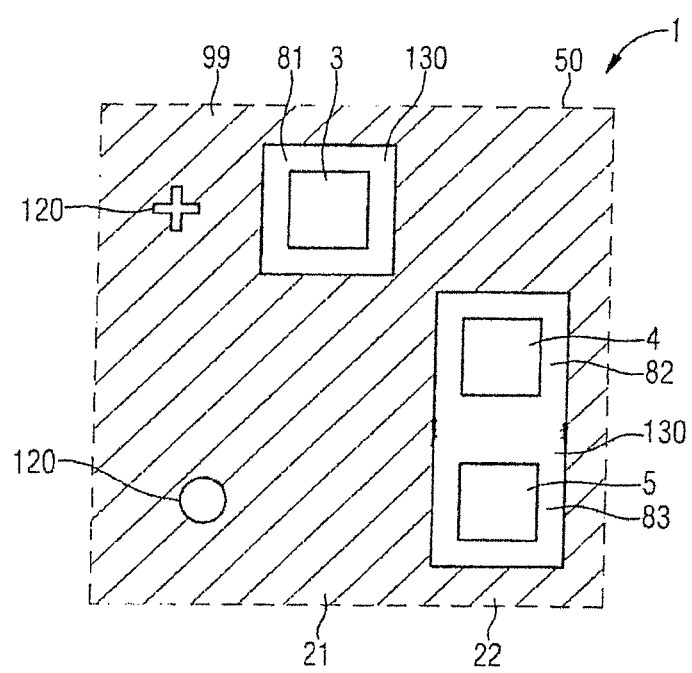
FIG. 15 shows a schematic illustration of a partial excerpt from a further module comprising an insulation layer.

FIG. 15 shows an excerpt from a module in accordance with FIG. 14, but wherein the second and the third light emitting chip 4, 5 are arranged jointly in an opening 130 of the insulation layer 99. An arrangement of the two light emitting chips 4, 5 with a smaller distance compared to the arrangement in FIG. 14 is achieved as a result. The second light emitting chip 4 may be configured to generate green light. The third light emitting chip 5 may be configured to generate blue light. The second and the third light emitting chip may also generate light comprising the same wavelength. Moreover, the second and the third light emitting chip may also be configured to generate light comprising a different wavelength than green light or blue light. Moreover, it is also possible for more than two light emitting chips, in particular three or more light emitting chips, to be arranged in a common opening. By way of example, one light emitting chip may emit green light, the second light emitting chip may emit blue light and the third light emitting chip may emit red light. The insulation layer may be arranged with openings only in the region of the contact sections or over the whole area on the module.

Figure 16:
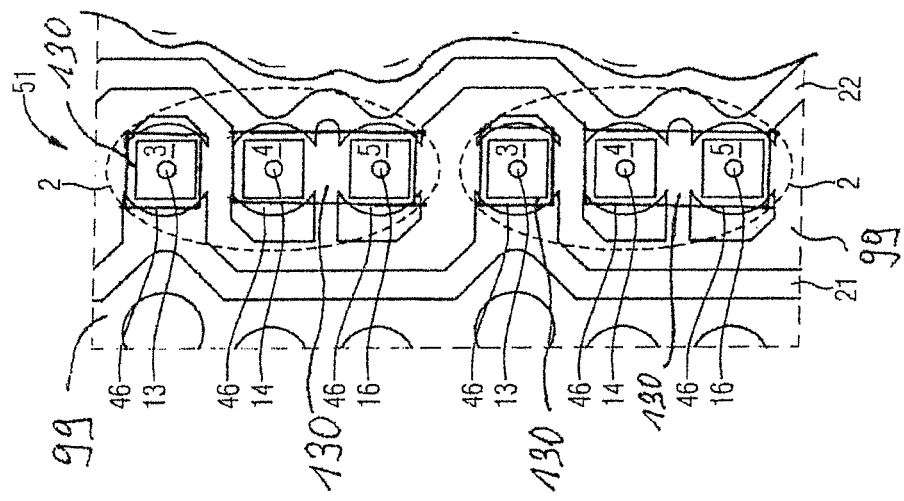
FIG. 16 shows a schematic illustration of a partial excerpt from a further module comprising an insulation layer.

FIG. 16 shows an excerpt from a module from FIG. 5, but wherein the conduction plane of the module is covered with an insulation layer 99. The insulation layer 99 comprises openings 130. The first light emitting chip 3 is arranged in an opening 130 of the insulation layer 99. The second and the third light emitting chip 4, 5 are arranged in a common further opening 130 of the insulation layer 99. It is also possible for more than two light emitting chips, in particular three or more light emitting chips, to be arranged in an opening. By way of example, one light emitting chip may emit green light, the second light emitting chip may emit blue light and the third light emitting chip may emit red light. The insulation layer may be arranged with openings only in the region of the contact sections or over the whole area on the module.

Figure 17:
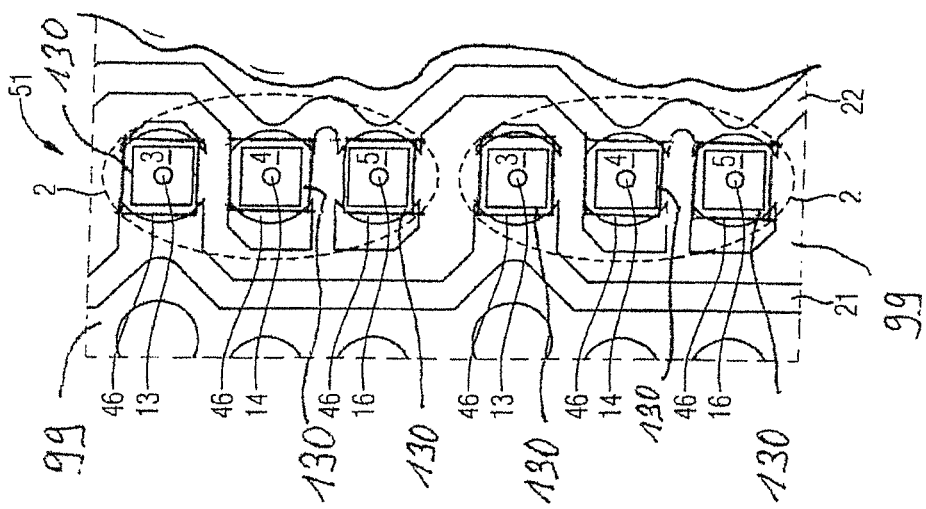
FIG. 17 shows a schematic illustration of a partial excerpt from a further module comprising an insulation layer.

FIG. 17 shows an excerpt from a module from FIG. 5, but wherein the conduction plane of the module is covered with an insulation layer 99. The insulation layer 99 comprises openings 130. The first light emitting chip 3 is arranged in an opening 130 of the insulation layer 99. The second light emitting chip 4 is arranged in a second opening 130 of the insulation layer 99. The third light emitting chip 5 is arranged in a third opening 130 of the insulation layer 99. The insulation layer may be arranged with openings only in the region of the contact sections or over the whole area on the module.

In an analogous manner, the module from FIG. 6 may also be covered with an insulation layer 99 comprising openings 130, wherein the light emitting chips are arranged in the openings 130.

Although our modules have been more specifically illustrated and described in detail by preferred examples, nevertheless this disclosure is not restricted by the examples disclosed and other variations may be derived therefrom by those skilled in the art, without departing from the scope of protection of the appended claims.

This application claims priority of DE 10 2015 119 653.0, the subject matter of which is incorporated herein by reference.

The invention claimed is:

1. A module for a video wall comprising a carrier comprising a multiplicity of image pixels, wherein an image pixel is formed by at least one first and one second light emitting chip, each light emitting chip comprises a first and a second electrical terminal, the first light emitting chip of an image pixel connects to a first power line by the first electrical terminal, the first light emitting chip of an image pixel connects to a third power line by the second electrical terminal, the second light emitting chip of the image pixel connects to a second power line by the first electrical terminal, the second light emitting chip of the image pixel connects to a fourth power line by the second electrical terminal, the first power line is in the form of a first surface metallization and the second power line is in the form of a second surface metallization, the first surface metallization comprises a first contact section, the second surface metallization comprises a second contact section, the first light emitting chip is arranged on the first contact section, the second light emitting chip is arranged on the second contact section, at least between the first contact section of the first power line and the second contact section of the second power line an insulation layer is arranged on the carrier, the insulation layer comprises a first opening above the first contact section and a second opening above the second contact section, and the first light emitting chip is arranged in the first opening and the second light emitting chip is arranged in the second opening.

2. The module according to claim 1, wherein the image pixels each comprise a third light emitting chip, the third light emitting chip comprises a first and a second electrical terminal, the third light emitting chip is connected to the first power line by the first electrical terminal, and the third light emitting chip is connected to a fifth power line by the second electrical terminal.

3. The module according to claim 1, wherein the image pixels each comprise a third light emitting chip, the third light emitting chip comprises a first and a second electrical terminal, the third light emitting chip is connected to a sixth power line by the first electrical terminal, and the third light emitting chip is connected to the fifth power line by the second electrical terminal.

4. The module according to claim 1, wherein the first power lines and the second power lines are led in one plane, and the third, fourth and fifth power lines are led in a second plane.

5. The module according to claim 4, wherein the first, the second and the third power lines are led via plated-through holes to a common connecting plane, and a fourth, a fifth and a sixth power line are led via plated-through holes to a common connecting plane.

6. The module according to claim 1, wherein the light emitting chips are arranged in rows, and the first and the second power line are arranged at opposite sides of the rows.

7. The module according to claim 6, wherein plated-through holes are provided between first power lines of two adjacent rows of light emitting chips to lead the first and/or the second and/or the third power line into a common connecting plane.

8. The module according to claim 6, wherein the light emitting chip comprises a stepped configuration on the side facing the contact section such that the light emitting chip does not bear by its entire side on the contact section.

9. The module according to claim 6, wherein, between the light emitting chips of an image pixel, insulation barriers are at least partly arranged on the carrier in order to improve an electrical insulation of the light emitting chips from one another.

10. The module according to claim 6, wherein an electrically conductive contact film is arranged between the contact section and the assigned light emitting chip, said contact film electrically connecting the light emitting chip to the contact section.

11. The module according to claim 8, wherein the light emitting chip is soldered onto the contact section by a solder connection by an AuSn solder connection, and a solidus temperature of the solder connection is above 260° C.

12. The module according to claim 8, wherein the light emitting chip connects to the contact section with the aid of a friction welding connection, and/or the light emitting chip connects to the contact section with the aid of a soldering.

13. The module according to claim 8, wherein an insulation web is provided between contact sections of a first and of a second power line.

14. The module according to claim 8, wherein the light emitting chip is mechanically secured on a contact section with the aid of an electrically insulating adhesive, and tips of a metallic contact of the light emitting chip penetrate through the adhesive and are in electrical contact with the contact section.

15. The module according to claim 6, wherein at least two light emitting chips are arranged in an opening of the insulation layer.

16. A module for a video wall comprising a carrier comprising a multiplicity of image pixels, wherein an image pixel is formed by at least one first and one second light emitting chip, each light emitting chip comprises a first and a second electrical terminal, the first light emitting chip of an image pixel connects to a first power line by the first electrical terminal, the first light emitting chip of an image pixel connects to a third power line by the second electrical terminal, the second light emitting chip of the image pixel connects to a second power line by the first electrical terminal, the second light emitting chip of the image pixel connects to a fourth power line by the second electrical terminal, the first and/or the second power line are/is in the form of a surface metallization, the surface metallization comprises contact sections, a light emitting chip is arranged on a contact section, at least between contact sections of a first and of a second power line an insulation layer is provided on the carrier, the insulation layer comprises openings above the contact sections, and the light emitting chips are arranged in the openings, wherein the first power lines and the second power lines are led in one plane, and the third, fourth and fifth power lines are led in a second plane, wherein the first, the second and the third power lines are led via plated-through holes to a common connecting plane, and a fourth, a fifth and a sixth power line are led via plated-through holes to a common connecting plane.

17. A module for a video wall comprising a carrier comprising a multiplicity of image pixels, wherein an image pixel is formed by at least one first and one second light emitting chip, each light emitting chip comprises a first and a second electrical terminal, the first light emitting chip of an image pixel connects to a first power line by the first electrical terminal, the first light emitting chip of an image pixel connects to a third power line by the second electrical terminal, the second light emitting chip of the image pixel connects to a second power line by the first electrical terminal, the second light emitting chip of the image pixel connects to a fourth power line by the second electrical terminal, the first power line is in the form of a first surface metallization and the second power line is in the form of a second surface metallization, the first surface metallization comprises a first contact section, the second surface metallization comprises a second contact section, the first light emitting chip is arranged on the first contact section, the second light emitting chip is arranged on the second contact section, at least between the first contact section of the first power line and the second contact section of the second power line an insulation layer is arranged directly on the carrier.

* * * * *